(12) United States Patent
Gallhauser et al.

(10) Patent No.: US 10,693,572 B2
(45) Date of Patent: Jun. 23, 2020

(54) MEASURING SYSTEM FOR OVER-THE-AIR POWER MEASUREMENTS WITH ACTIVE TRANSMISSION

(71) Applicant: Rohde & Schwarz GmbH & Co. KG, Munich (DE)

(72) Inventors: Markus Gallhauser, Freising (DE); Werner Perndl, Zorneding (DE); Nino Voss, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 19 days.

(21) Appl. No.: 15/474,653

(22) Filed: Mar. 30, 2017

(65) Prior Publication Data

US 2017/0244499 A1 Aug. 24, 2017

Related U.S. Application Data

(63) Continuation of application No. 15/214,114, filed on Jul. 19, 2016, now Pat. No. 10,135,553.

(30) Foreign Application Priority Data

Feb. 19, 2016 (EP) ..................................... 16156454

(51) Int. Cl.
*H03C 1/62* (2006.01)
*H04B 17/318* (2015.01)
(Continued)

(52) U.S. Cl.
CPC ........... *H04B 17/318* (2015.01); *G01R 19/04* (2013.01); *G01R 21/10* (2013.01); *G01R 21/14* (2013.01);
(Continued)

(58) Field of Classification Search
CPC ..... H04W 24/08; H04W 24/10; H04W 24/06; H04W 36/0088; H04B 17/318;
(Continued)

(56) References Cited

U.S. PATENT DOCUMENTS 4,910,791 A * 3/1990 Dickinson ................ H04B 3/10
                                                    379/22.02
5,083,080 A * 1/1992 Tagiri ..................... G01R 27/28
                                                    324/115
(Continued)

FOREIGN PATENT DOCUMENTS

| CN | 2299398 Y | 12/1998 |
|----|-----------|---------|
| DE | 19913338 A1 | 9/2000 |
| DE | 102006038031 A1 | 11/2007 |

OTHER PUBLICATIONS

European Office Action for corresponding European Patent Application No. 16156454.7—1568 dated Aug. 8, 2016, 8 Pages.

(Continued)

*Primary Examiner* — Edward F Urban
*Assistant Examiner* — Max Mathew
(74) *Attorney, Agent, or Firm* — Dittavong & Steiner, P.C.

(57) ABSTRACT

A measuring system for performing over the air power measurements is provided. The measuring system comprises, within a single housing, a detector module, comprising a detector input, a transmitter module, comprising a transmitter output, and an antenna. The detector input and the transmitter output are at least temporarily connected. At least the transmitter output or the detector input are at least temporarily connected to the antenna.

11 Claims, 13 Drawing Sheets

(51) Int. Cl.

| | | |
|---|---|---|
| *G01R 19/04* | (2006.01) | |
| *G01R 21/10* | (2006.01) | |
| *G01R 21/14* | (2006.01) | |
| *G01R 23/00* | (2006.01) | |
| *G01R 29/08* | (2006.01) | |
| *H04B 17/10* | (2015.01) | |
| *H04B 17/00* | (2015.01) | |

(52) U.S. Cl.
CPC ......... *G01R 23/00* (2013.01); *G01R 29/0878* (2013.01); *H04B 17/0085* (2013.01); *H04B 17/102* (2015.01)

(58) Field of Classification Search
CPC .. H04B 17/0085; H04B 17/29; H04B 17/309; H04B 17/19; H04B 17/18; H04B 17/101; H04B 1/0007; G01R 23/16; G01R 15/09; G01R 19/0092; G01R 15/08
USPC ..... 455/67.11–67.7, 72, 67.14, 226.1, 226.2, 455/226.4; 324/76.19, 118, 115, 616, 324/611; 381/105
See application file for complete search history.

(56) References Cited

U.S. PATENT DOCUMENTS

| | | | | |
|---|---|---|---|---|
| 5,489,888 A * | 2/1996 | Jagiella | ............ | G01B 7/023 324/611 |
| 7,133,644 B2 * | 11/2006 | Demir | ............ | H04B 1/0475 455/67.11 |
| 7,283,792 B2 * | 10/2007 | Chmiel | ............ | H03G 3/3042 330/129 |
| 7,376,200 B2 * | 5/2008 | Demir | ............ | H03C 3/406 375/296 |
| 7,379,716 B2 * | 5/2008 | Eisenstadt | ............ | H03F 3/24 455/115.1 |
| 7,457,594 B2 * | 11/2008 | Theobold | ............ | G01R 29/0878 455/115.1 |
| 7,561,878 B2 * | 7/2009 | Tam | ............ | H04W 24/00 370/241 |
| 8,964,877 B2 * | 2/2015 | Weinrib | ............ | H04B 1/1036 375/285 |
| 9,146,277 B2 * | 9/2015 | Redlich | ............ | G01R 31/31905 |
| 2004/0077316 A1 * | 4/2004 | Xiong | ............ | H04B 1/46 455/78 |
| 2005/0156607 A1 * | 7/2005 | Okamura | ............ | G01F 23/284 324/639 |
| 2006/0258293 A1 * | 11/2006 | Steffen | ............ | G01R 23/00 455/67.11 |
| 2007/0222609 A1 * | 9/2007 | Duron | ............ | G06K 7/0008 340/572.7 |
| 2008/0143552 A1 * | 6/2008 | Mallison | ............ | E21B 47/06 340/853.1 |
| 2008/0165252 A1 * | 7/2008 | Kamimura | ............ | H04N 7/181 348/155 |
| 2009/0063085 A1 * | 3/2009 | Conner | ............ | G01R 31/31924 702/117 |
| 2010/0289477 A1 * | 11/2010 | Reichel | ............ | G01R 19/02 324/76.19 |
| 2011/0050515 A1 * | 3/2011 | Liu | ............ | H01Q 21/24 343/703 |
| 2011/0050536 A1 * | 3/2011 | Shtatnov | ............ | H01Q 7/005 343/870 |
| 2011/0171912 A1 * | 7/2011 | Beck | ............ | G01S 5/0221 455/67.11 |
| 2011/0300809 A1 * | 12/2011 | Gordiyenko | ............ | H04B 17/23 455/67.12 |
| 2013/0193985 A1 * | 8/2013 | Tillotson | ............ | H03K 17/9525 324/616 |
| 2013/0217343 A1 * | 8/2013 | Tenbroek | ............ | H04W 24/00 455/77 |
| 2013/0237164 A1 * | 9/2013 | Chien | ............ | H04B 17/12 455/78 |
| 2013/0331042 A1 * | 12/2013 | See | ............ | H04W 52/367 455/77 |
| 2014/0329472 A1 * | 11/2014 | Kovacs | ............ | H04B 17/0085 455/67.14 |
| 2014/0368227 A1 * | 12/2014 | Benoit | ............ | G01R 31/2884 324/750.3 |
| 2015/0155955 A1 * | 6/2015 | Chang | ............ | H04L 25/03261 375/226 |
| 2016/0124041 A1 * | 5/2016 | Pathak | ............ | G01R 29/08 324/629 |
| 2016/0380352 A1 * | 12/2016 | Liu | ............ | H04W 16/28 342/359 |
| 2017/0026020 A1 * | 1/2017 | Solomko | ............ | H01P 5/184 |
| 2017/0171012 A1 * | 6/2017 | Darwish | ............ | H03C 5/00 |
| 2017/0237161 A1 * | 8/2017 | Roy | ............ | H01Q 1/288 343/757 |

OTHER PUBLICATIONS

Nelson, "High-frequency Instruments", EDN Magazine, vol. 26, No. 4, Feb. 1981, pp. 77-88, 12 Pages.

Li et al., "Wide-Band VCOs in SiGe Production Technology Operating Up to About 70 GHz", IEEE Microwave and Wireless Components Letters., vol. 13. No. 10, Oct. 2003, 3 Pages.

Liu et al., "Fully Integrated Millimeter-Wave VCO with 32% Tuning Range", Silicon Monolithic Integrated Circuits in RF Systems, IEEE Topical Meeting, 2009, 4 Pages.

NASR et al., "A Wide Tuning Range High Output Power 56-74 GHz VCO With On-Chip Transformer Load in SiGe Technology", Silicon Monolithic Integrated Circuits in RF Systems, IEEE 12th Topical Meeting, 2012, 4 Pages.

Li et al., "A 23.67-to-45-GHz Wide Tuning Range Dual VCI with Phase Noise Enhancement in 90-nm CMOS Technology", Microwave Symposium Digest (IMS), IEEE MTT-S International, 2013, 3 Pages.

* cited by examiner

MEASURING SYSTEM FOR OVER-THE-AIR POWER MEASUREMENTS WITH ACTIVE TRANSMISSION

RELATED APPLICATIONS

The present application is a continuation-in-part of U.S. application Ser. No. 15/214,114, filed on Jul. 19, 2016, which claims priority to European Patent Application EP 16 156 454.7, filed on Feb. 19, 2016, the entire contents of which are incorporated herein by reference.

TECHNICAL FIELD

The invention relates to a measuring system for wirelessly measuring high frequency signals, especially the power of high frequency signals, and measuring a reaction of a device under test to signals.

BACKGROUND ART

In recent years, the frequencies employed for transmitting communications signals have continually risen. When measuring such high frequencies, a new set of problems has arisen. Directly connecting a device under test to a measuring device influences the measuring results. Placing a large measuring antenna close to the device under test is also problematic.

For example, the German patent application DE 199 13 338 A1 shows a measuring circuit for detecting the power of high frequency signals.

The system shown there especially does not show how to handle devices under test, which can receive signals as well. Especially a testing of such devices under test is not shown there.

There arises the need to provide a measuring system, which is able to measure signals of very high frequency emitted by devices under test and is able to measure a reaction of a device under test to incoming signals.

SUMMARY OF THE INVENTION

According to a first aspect of the invention, a measuring system for performing over the air power measurements is provided. The measuring system comprises, within a single housing, a detector module, comprising a detector input, and a transmitter module, comprising a transmitter output, and an antenna. The detector input and the transmitter output are at least temporarily connected. At least the transmitter output or the detector input are at least temporarily connected to the antenna. It is thereby possible to perform over the air power measurements of signals emitted by the device under test as well as to transmit signals to the device under test.

According to a first implementation form of the first aspect, the detector input and the transmitter output are connected in a switchable manner. This prevents interference between the two units.

According to a second implementation form of the first aspect, the detector input and the transmitter output are connected interchangeably switchable to the antenna. This also prevents interference between the different units.

According to a third implementation form of the first aspect, the detector input and the transmitter output are connected by a power splitter, or by a power divider, or by a power coupler. Thereby, it is possible to separate between incoming and outgoing signals, thereby preventing interference.

According to a fourth implementation form of the first aspect, the detector input and the transmitter output are connected by a power coupler. The power coupler is adapted to couple out a first signal, proportional to a signal received by the antenna, and/or a second signal, proportional to a signal transmitted by the transmitter module. It is thereby possible, to measure the signal received by the antenna and the signal transmitted by the transmitter module without interfering.

According to a fifth implementation form, the detector input and the transmitter output are connected by a power coupler. The detector module is connected to a direct path of the power coupler. The power coupler is adapted to couple out a first signal, proportional to a signal transmitted by the transmitter module, and couple in a second signal transmitted by the transmitter module. This is especially effectively prevents negative influence upon the measurement of the power of the signal emitted by the device under test.

According to a sixth implementation form, the transmitter module comprises a signal source. It is thereby possible to generate the signal transmitted by the transmitter module without any additional necessary hardware.

According to a further implementation form of the first aspect, the signal source is a voltage controlled oscillator, or a frequency controlled oscillator, or a synthesizer. Thereby, an especially simple construction of the signal source is possible.

According to a further implementation form of the first aspect, the signal source is adapted to be regulated in a digital manner. This allows for a simple regulation of the signal source.

According to a further implementation form of the first aspect, the signal source is adapted to be regulated in an analog manner. This alternative also allows for a very simple regulation of the signal source.

According to a further implementation form of the first aspect, the transmitter module comprises an amplifier or a dampener. This allows for a regulation of the amplitude of the signal transmitted by the transmitter module.

According to a further implementation form of the first aspect, the transmitter module comprises an input, which is connected to an external signal source. This allows for an especially simple construction of the measuring system, since the signal transmitted by the transmitter module does not need to be generated by the transmitter module.

According to a further implementation form of the first aspect, the transmitter module comprises a mixer. This allows for regulating the frequency of the signal transmitted by the transmitter in a very simple manner.

According to a further implementation form of the first aspect, the mixer comprises an input, which is connected to an external signal source. This greatly simplifies the construction of the measuring system.

According to a further implementation form of the first aspect, the external signal source is a local oscillator, adapted to provide a local oscillator signal to the mixer. The mixer is then adapted to generate an intermediate frequency signal, by mixing with the local oscillator signal. Also this assures a very simple regulation of the frequency of the signal transmitted by the transmitter module.

BRIEF DESCRIPTION OF THE DRAWINGS

Exemplary embodiments of the invention is now further explained by way of example only with respect to the drawings, in which.

DETAILED DESCRIPTION OF THE PREFERRED EMBODIMENTS

Figure 1:
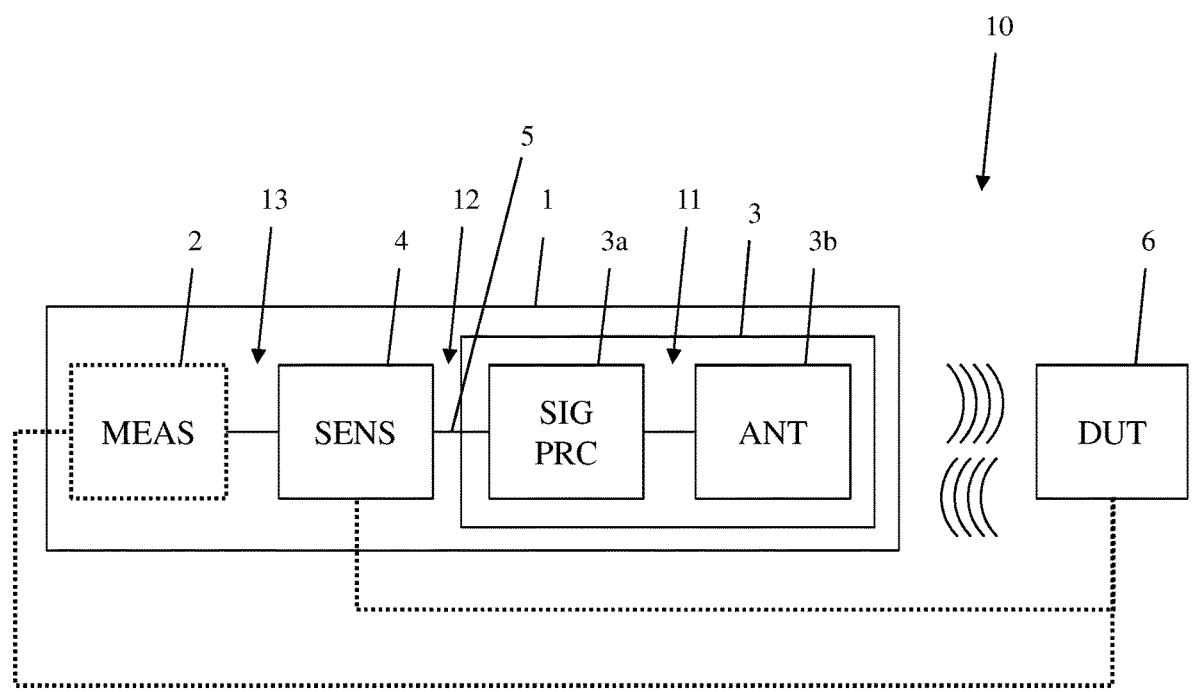
FIG. 1 shows a block diagram of a first embodiment of the measuring system according to the invention in a schematic diagram.
Figure 2:
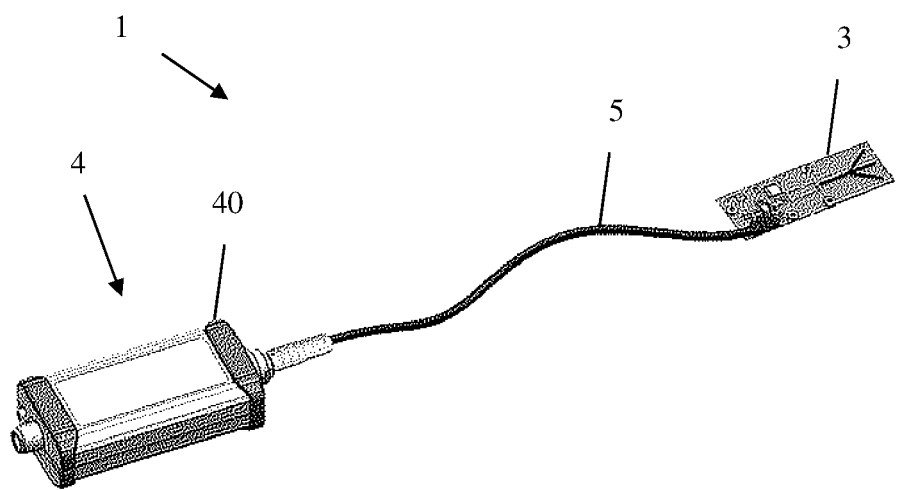
FIG. 2 shows a second embodiment of the measuring system according to the invention in a three-dimensional view.

First, we demonstrate the general setup of an embodiment of the measuring system along FIG. 1 and FIG. 2. Along FIG. 3 to FIG. 13, further details of the construction and function of different embodiments are shown. Similar entities and reference numbers in different figures have been partially omitted.

Reference will now be made in detail to the preferred embodiments of the present invention, examples of which are illustrated in the accompanying drawings. However, the following embodiments of the present invention may be variously modified and the range of the present invention is not limited by the following embodiments.

First Embodiment

In FIG. 1, a first embodiment of the measuring system 1 according to the first aspect of the invention is shown. The measuring system 1 comprises a measuring device 2, which is connected to a sensor module 4, which in turn is connected to a signal processing module 3a. The signal processing module 3a comprises a detector module and a transmitter module, which are described in greater detail along FIG. 3 and FIGS. 5-13.

The signal processing module 3a in turn is connected to an antenna module 3b. The signal processing module 3a and the antenna module 3b form a combined module 3. The signal processing module 3a and the sensor module 4 are connected via a cable 5. The cable 5 can be an electrical cable or an optical cable. Especially, it can be a coaxial cable or a fiber-optic cable.

The measuring device 2 is a stand-alone measuring device, for example a signal analyzer. It is important to note that the measuring device 2 is only an optional component and not necessary for the invention. In case it is used, the measuring device is connected via a cable to the sensor module 4. The sensor module 4 for example is a power sensor. Also a wireless connection is possible.

Advantageously, the signal processing module 3a and the antenna module 3b each comprise a single printed circuit board holding all further components of the respective modules 3a, 3b. In case of using a combined module 3, the combined module 3 advantageously comprises only a single printed circuit board holding all components of the signal processing module 3a and the antenna module 3b.

For performing a measurement, a device under test 6 is placed close to the antenna module 3b in a main radiation direction of an antenna of the antenna module 3b.

In a first measuring direction, the device under test 6 emits a high frequency signal 10, which is received by the antenna of the antenna module 3b. The antenna module 3b performs some pre-processing, which is described in greater detail along FIG. 3. The resulting pre-processed signal 11 is passed on to the signal processing module 3a, especially to the detector module within the signal processing module 3a. The detector module performs further pre-processing, transforming the pre-processed signal into a measuring signal 12, which is handed to the sensor module 4.

The sensor module 4 performs the measurement of the measuring signal 12, determining for example the power of the high frequency signal 10 emitted by the device under test 6. A measuring result 13 can now be transmitted for example to a computer or to a further measuring device 2, which stores or further processes the measuring result 13.

In a second measuring direction, the transmitter module within the signal processing module 3a transmits a signal to the device under test 6 using the antenna module 3b. The signal is received by the device under test 6. The device under test 6 processes the signal and reacts by either determining measuring results and handing them to the sensor module 4 or to the measuring device 2 through an optional separate connection, or by according to the received signal, generating the signal according to the first measuring direction shown above.

Especially, this allows for testing the reception path of the device under test 6 regarding a signal amplitude and regarding a beamforming.

If the device under test 6 is an antenna array or comprises an antenna array, the measuring system may additionally comprise a positioning unit, which is adapted for positioning each individual antenna of the antenna array directly in front of the antenna of the antenna module 3b. In this case, according measurements may be repeated for each individual antenna of the antenna array.

Second Embodiment

In FIG. 2, a three-dimensional image of the measuring system 1 is depicted. Especially, the sensor module 4, the cable 5 and the combined module 3, which comprises the signal processing module 3a and the antenna module 3b of FIG. 1, is clearly visible. Here, it is especially evident that the sensor module 4 comprises a housing 40, which does not encompass the signal processing module 3a and the antenna module 3b, which are comprised by the combined module 3. Also, it is shown here, that the combined module 3 comprises a single printed circuit board, which holds all further components of the combined module 3.

Regarding the specific construction and function of the sensor module 4, the signal processing module 3a and the antenna module 3b, it is referred to FIG. 3 to FIG. 13.

Third Embodiment

Figure 3:
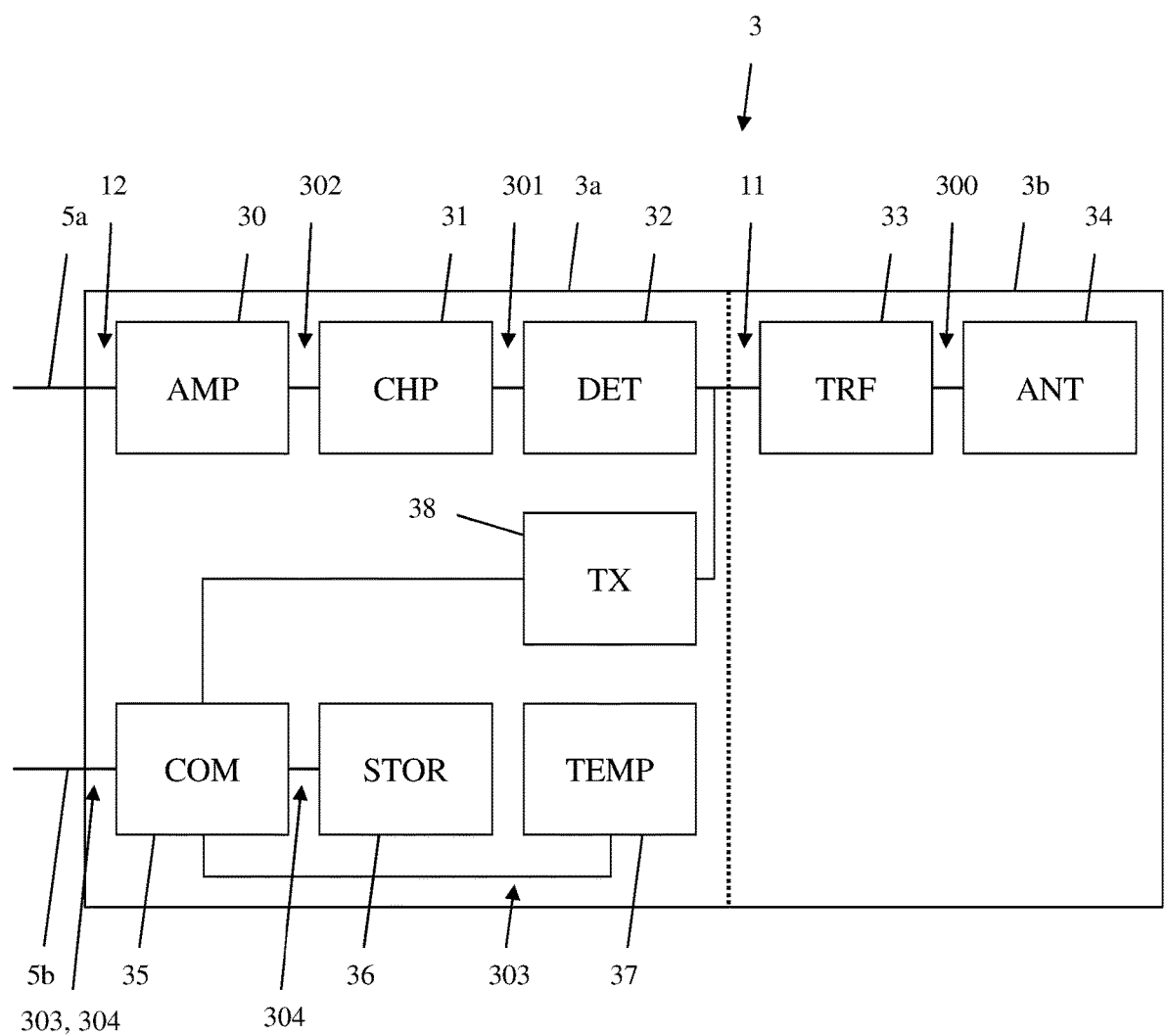
FIG. 3 shows a block diagram of a third embodiment of the measuring system according to the invention in a schematic diagram.

In FIG. 3, the signal processing module 3a and the antenna module 3b of FIG. 1 are shown in greater detail. Here, the detector module 3a and the antenna module 3b are integrated into a combined module 3. The combined module 3, comprises an antenna 34, which is connected to a transformer 33. Both, the antenna 34 and the transformer 33 are arranged on the antenna module 3b part of the combined module 3. The antenna 34 advantageously is a planar antenna, advantageously a planar slotline antenna.

In order to achieve optimal reception and transmission conditions without interfering reflections, an area surrounding the antenna 34 can be coated in radio frequency absorbing material. Also it is possible to slant all surfaces of the system 1 away from a normal of a main radiation direction of the antenna 34, so as to minimize reflections. Also a minimizing of surfaces facing the main radiation direction of the antenna 34 is beneficial for the same reason.

The transformer 33 is connected to a detector module 32, which in turn is connected to a chopper 31. The chopper 31 is connected to an amplifier 30, which again is connected to a cable 5a, which is part of the cable 5 of FIG. 1 and FIG. 2. Moreover, a transmitter module 38 is connected to the transformer 33. The transmitter module 38, the detector 32, the chopper 31 and the amplifier 30 are all integrated into the signal processing module 3a part of the combined module 3. Moreover, the signal processing module 3a part of the combined module 3 comprises a temperature sensor 37, a storage unit 36 and a communication unit 35. The temperature sensor 37, the transmitter module 38, and the storage unit 36 are both connected to the communication unit 35, which in turn is connected to a cable 5b, which is part of the cable 5 of FIG. 1 and FIG. 2.

In the first measuring direction, when the device under test 6 emits the high frequency signal 10, the high frequency signal 10 is received by the antenna 34 as an antenna signal, preferably as a slotline antenna signal. The antenna 34 in this example is a slotline antenna, which receives the high frequency signal 10 and makes it available as a slotline antenna signal 300 to the transformer 33. Handling such a slotline antenna signal is very complicated. Therefore, the transformer 33 transforms the slotline antenna signal 300 to a coplanar antenna signal 11 of FIG. 1 and FIG. 2, which is handed to the detector module 32. The detector module 32 performs a detection of the signal 11, advantageously it performs a rectification of the coplanar antenna signal 11. A resulting signal 301 is provided to the chopper 31, which performs a low-frequency modulation by continuously inverting the polarity of the signal 301. This reduces the interference sensitivity of the resulting signal 302. The chopped signal 302 is handed to the amplifier 30, which amplifies it and transmits a resulting signal 12 over the cable 5a to the sensor module 4.

At the same time, the temperature sensor 37 determines a present temperature 303 and hands it on to the communication unit 35. The communication unit 35 transmits the current temperature 303 determined by the temperature sensor 37 through the cable 5b to the sensor module 4.

The storage unit 36 stores parameters of the detector module 3a and/or the antenna module 3b. These can be, for example, calibration details of the modules 3a, 3b. These are individual for each specific antenna module 3b and signal processing module 3a. For example, the storage unit 36 can be a flash memory or a magnetic memory. This information 304 is also transmitted by the communication unit 35 to the sensor module 4.

Instead of storing the parameters of the detector module 3a and/or the antenna module 3b in an electronically readable storage unit 36 as shown in FIG. 3, it is also possible to store this information in a wirelessly readable format, for example an RFID chip.

In an especially simple implementation form, the parameters can also be stored in form of a barcode, especially a two-dimensional barcode printed or glued to the surface of the signal processing module 3a and/or antenna module 3b. Also in this case, the sensor module 4 comprises a respective barcode reader capable of reading the information stored within the barcode.

The temperature sensor 37, the storage unit 36 and the communication unit 35 can also be arranged on the antenna module 3b. It is even possible to provide a separate temperature sensor for the signal processing module 3a and for the antenna module 3b. An especially accurate determining of the temperature of the individual components is thereby possible.

Advantageously, the antenna module 3b or the signal processing module 3a furthermore comprises a mixer and a local oscillator, which are adapted to mix a signal derived from the high frequency signal 10 with a local oscillator signal, resulting in an intermediate frequency signal of lower frequency than the high frequency signal. This intermediate frequency signal is then further processed as described above. It must be noted, that this frequency transformation can occur at any processing stage between the described antenna 34 and the described chopper 31.

In the second measuring direction, when the device under test 6 receives a measuring signal, this measuring signal is either generated or at least processed and handed on by the transmitter module 38. When the signal is generated by the transmitter module 38, the transmitter module is instructed, for example by the communication unit 35 to generate the signal and transmit it using the antenna 34.

Alternatively, the transmitter module 38 merely processes and hands on the signal to be transmitted to the device under test. In this case, the signal is provided to the transmitter module by for example the communication unit 35.

In both cases, the communication unit 35 may be supplied with the necessary instructions or signal by the measuring device 2 of FIG. 1. In both cases, the signed 300 is the signal to be emitted to the device under test.

Regarding the detailed construction and function of the transmitter unit, it is referred to the later elaborations along FIGS. 5-13.

Fourth Embodiment

Figure 4:
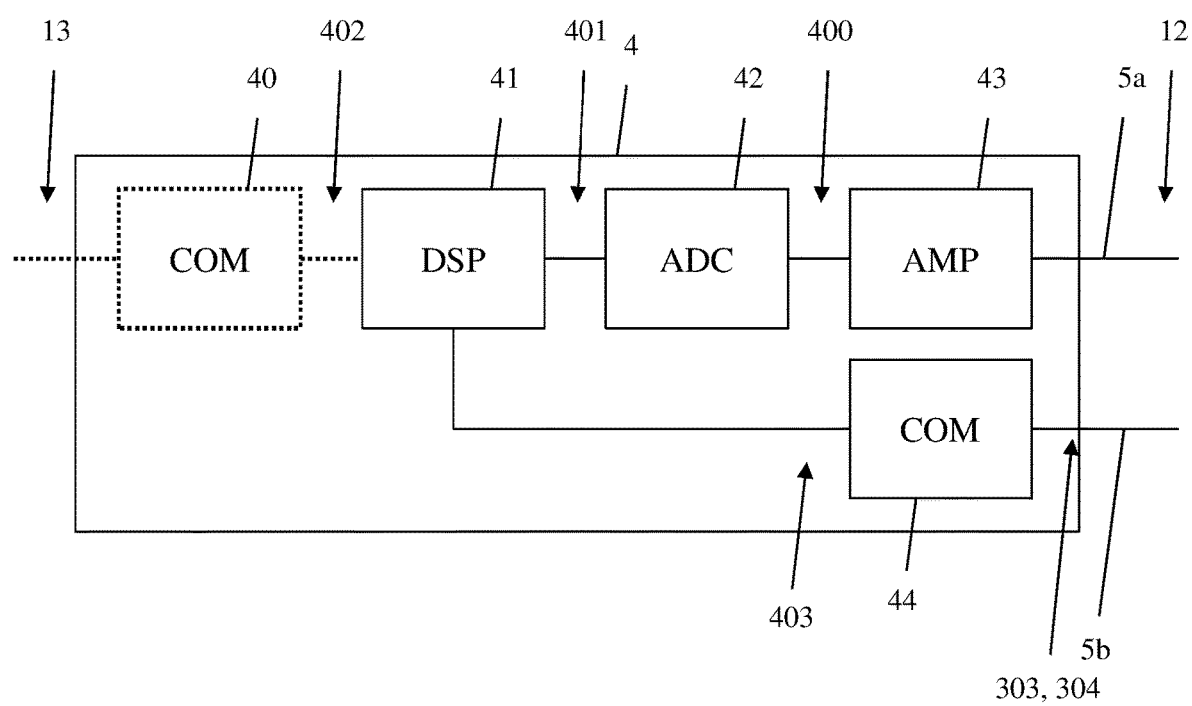
FIG. 4 shows a block diagram of a fourth embodiment of the measuring system according to the invention in a schematic diagram.

In FIG. 4, details of the construction of the sensor module 4 of FIG. 1 and FIG. 2 are shown. The sensor module 4 comprises a communication unit 40, connected to a digital signal processor 41. The digital signal processor 41 again is connected to an analog-digital-converter 42, which is connected to an amplifier 43. The amplifier 43 is connected to cable 5a of FIG. 3. Moreover, the digital signal processor 41 is connected to a further communication unit 44, which is connected to the cable 5b of FIG. 3.

In the first measuring direction, when receiving the measuring signal 12 through cable 5a from the amplifier 30 of FIG. 3, the amplifier 43 amplifies the signal 12 again, resulting in an amplified signal 400. The amplified signal 400 is provided to the analog-digital-converter 42, which digitizes it and provides a resulting digital signal 401 to the digital signal processor 41.

Through cable 5b, the communication unit 44 receives the temperature information 303 and parameter information 304 from the communication unit 35 of FIG. 3. The communication unit 44 provides this information 303, 304 to the digital signal processor 41.

In case the parameter information is stored in an RFID chip, the sensor module 4 comprises an RFID reader for reading this information and providing it to the digital signal processor 41. Also, in case the parameter information is stored in a barcode, the sensor module 4 comprises a barcode reader for reading this information and providing it to the digital signal processor 41.

The digital signal processor 41 performs a post-processing of the digitized measuring signal 401 taking the temperature information 303 and parameter information 304 provided by the communication unit 44 into account. Therefore, the digital signal processor 41 generates the final measuring result 402. It can be either stored within the sensor module 4 or transmitted to a further measuring device 2 by use of the optional communication unit 40 as measuring result 13.

In the second measuring direction, the communication unit 44 instructs the communication unit 35 of the signal processing module 3a to transmit a signal to the device under test 6. This signal can either be provided by the communication unit 44, which receives it from the digital signal processor 41 or even from the measuring device 2 by use of the further communication unit 40.

Alternatively, the communication unit 24 may instruct the signal processing module 3a, itself instructed by the digital signal processor 41, and optionally the measuring device 2, to generate the signal to be transmitted to the device under test. Regarding this signal generation or transmission, it is referred to the further elaborations regarding FIGS. 5-12.

Separating the sensor module 4 from the combined module 3, and especially from the signal processing module 3a and the antenna module 3b is especially advantageous, since it allows for providing small and simple components within the signal processing module 3a and antenna module 3b, allowing for placing these modules extremely close to the device under test, while providing large components within the sensor module 4, which can be placed at a significant distance from the device under test. Especially by performing this separation of components, it is possible to reduce the requirements regarding the transmission of high frequency signals, since the transmission through the cable 5 only has a low sensitivity to interference.

Also, this separation of components is advantageous, since it is possible to provide an optimal temperature control of the sensor module 4, while this is not possible for the signal processing module 3a and the antenna module 3b. Therefore, the analog-digital-converter which is especially prone to noise can be kept at optimally low temperatures.

Fifth Embodiment

Figure 5:
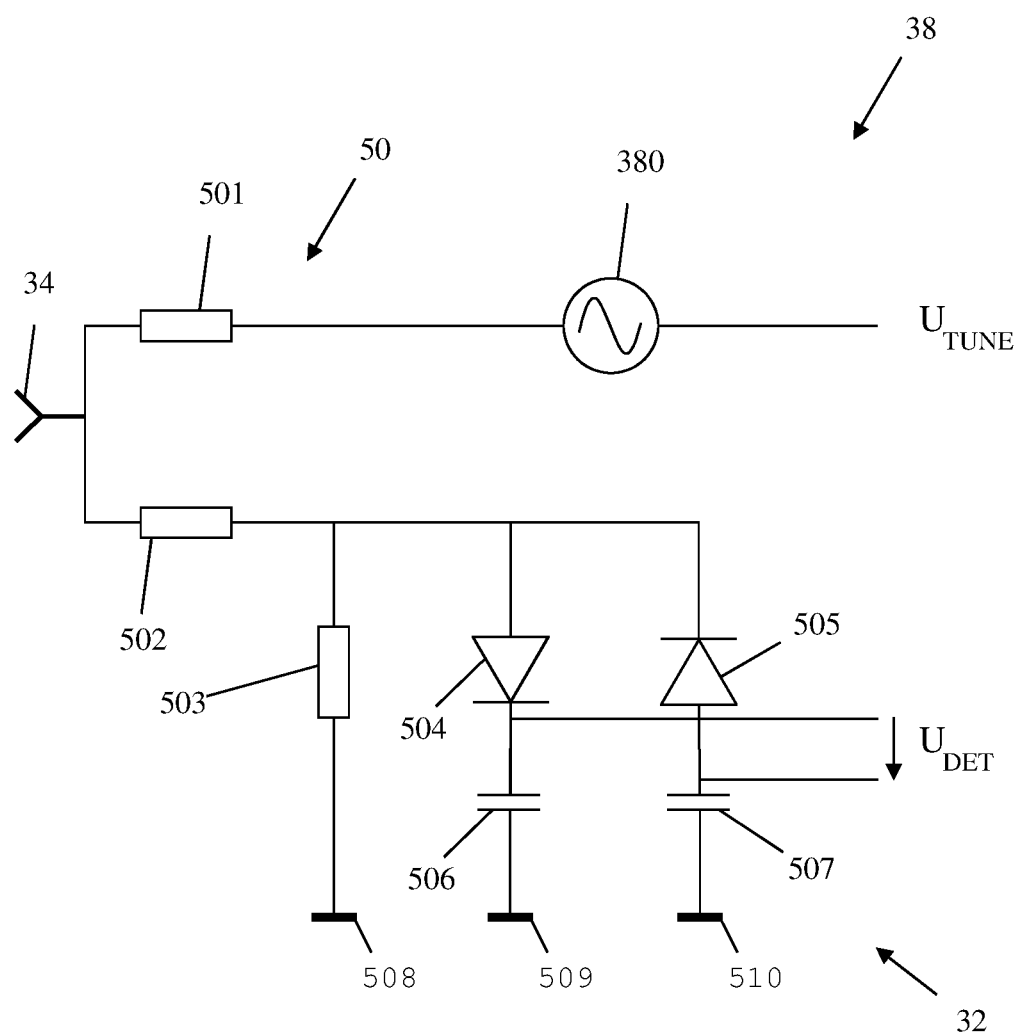
FIG. 5 shows a detail of a fifth embodiment of the measuring system according to the invention in a circuit diagram.

In FIG. 5, a further embodiment of the measuring system is shown. Here, details of the transmitter module 38, the detector module 32 and the antenna 34 are shown.

The antenna 34 is connected to a signal splitter 50, which consists of two identical ohmic resistors 501, 502. The first ohmic resistor 501 is moreover connected to a signal source 380, which is comprised by the transmitter module 38. The second ohmic resistor 502 of the signal splitter 50 is connected to the detector module 32. The detector module 32 comprises a first ohmic resistor 503, which is connected to mass 508. Moreover, connected parallel to the ohmic resistor 503 is a first diode 504, which is connected to a capacity 506, which in turn is connected to mass 509. Moreover, parallel connected is a second diode 505, which is moreover connected to a further capacitance 507, which then is connected to mass 510. The diodes 504 and 505 are polarized in reverse with regard to each other.

When a signal is to be transmitted, by the antenna 34 to the device under test, a tuning voltage $V_{TUNE}$ is supplied to the signal source 380, which generates a high frequency signal based thereupon. This high frequency signal passed the ohmic resistance 501 and is transmitted by the antenna 34.

In case of a reception of a signal by the antenna 34, the signal is received by the antenna 34 and split by the signal splitter 50. One part of the signal passes the ohmic resistor 502 and is detected by the detector diodes 504 and 505. The resulting detected voltage $V_{DET}$ is available between the diode 504 and the capacitance 506 with regard to between the diode 505 and the capacitance 507.

Sixth Embodiment

Figure 6:
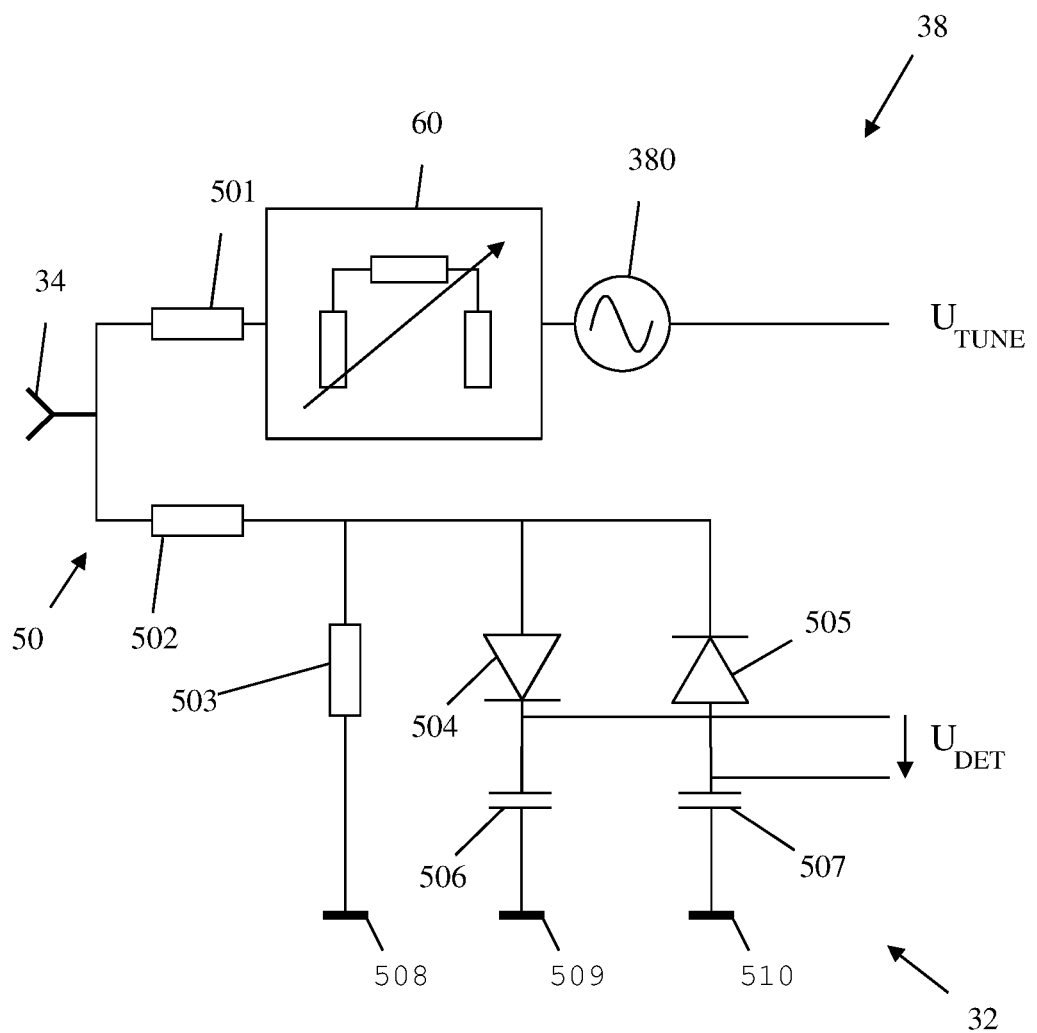
FIG. 6 shows a detail of a sixth embodiment of the measuring system according to the invention in a circuit diagram.

In FIG. 6 an alternative embodiment is shown. Here, additionally between the signal splitter 50 and the signal source 380, an attenuator 60 is connected. The attenuator 60 can reduce the amplitude of the signal generated by the signal source 380, in a controlled manner.

Seventh Embodiment

Figure 7:
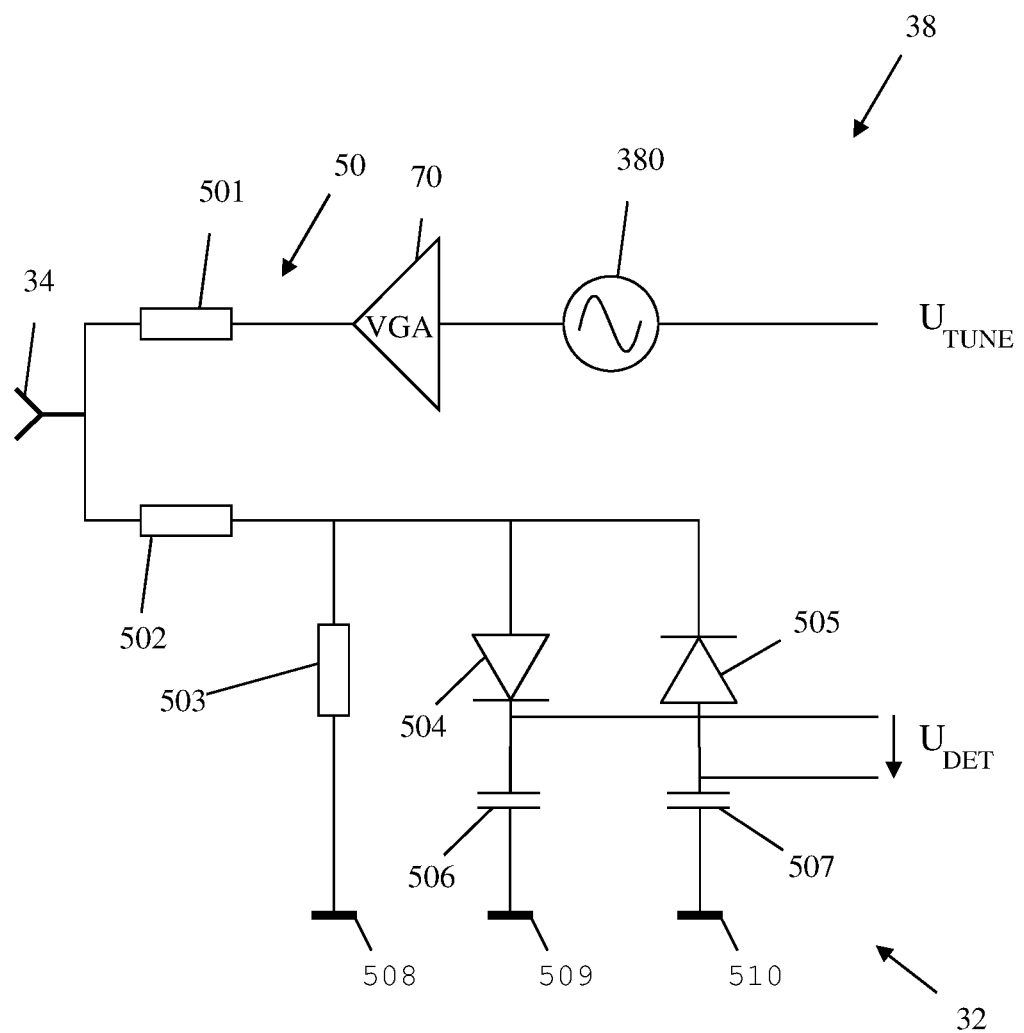
FIG. 7 shows a detail of a seventh embodiment of the measuring system according to the invention in a circuit diagram.

Moreover, in FIG. 7 a further alternative embodiment is shown. Here, between the signal splitter 50 and the signal source 380, a variable gain amplifier 70 is connected. The variable gain amplifier 70 can be used for increasing the amplitude of the signal generated by the signal source 380, in a controlled manner. By use of a setting signal, the desired amplitude can be controlled.

Eighth Embodiment

Figure 8:
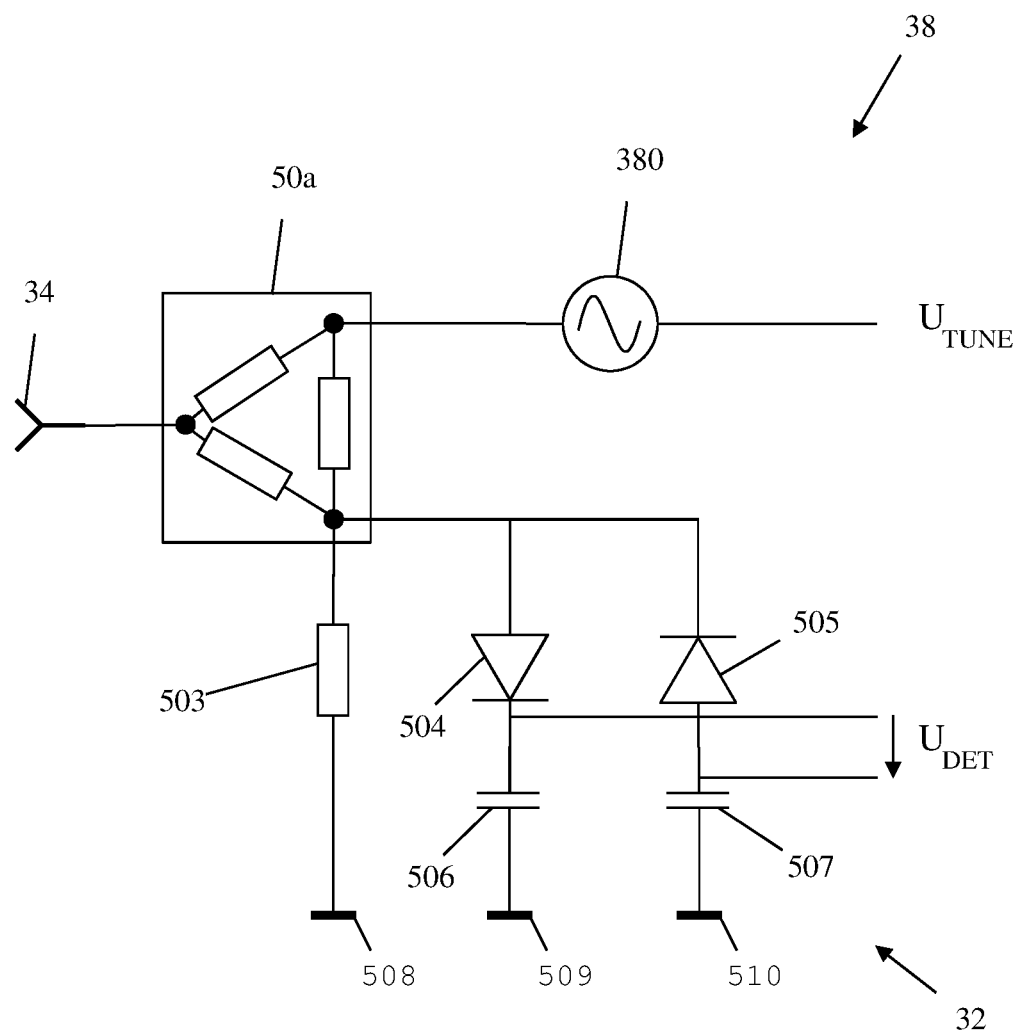
FIG. 8 shows a detail of an eighth embodiment of the measuring system according to the invention in a circuit diagram.

In FIG. 8, a further embodiment is shown. Here, the signal splitter 50 of FIGS. 5-7 has been replaced by a Wilkinson signal splitter 50a.

Ninth Embodiment

Figure 9:
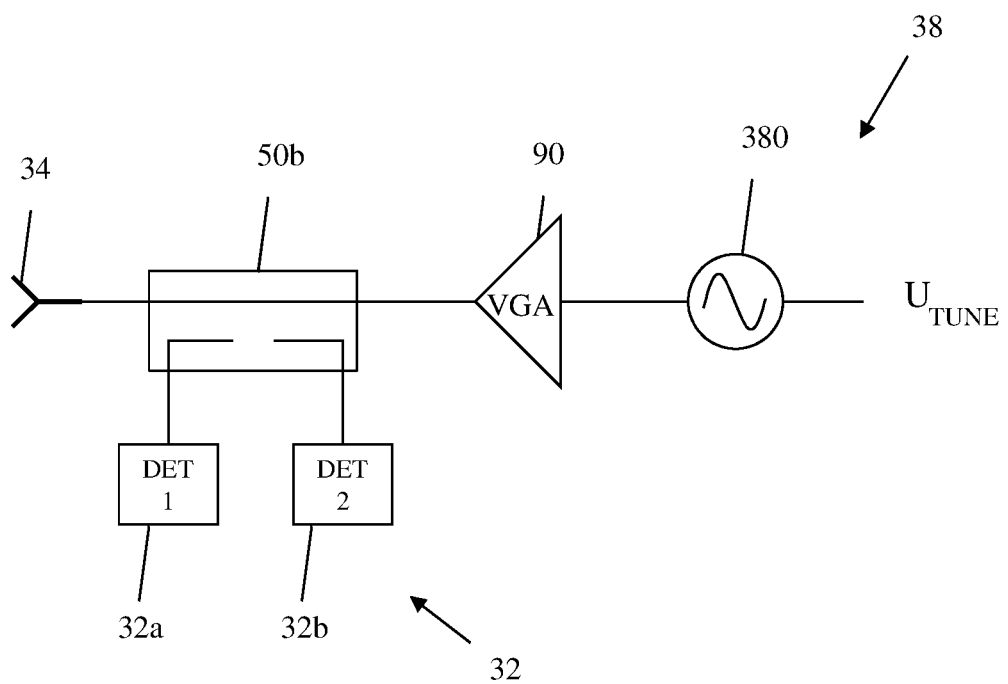
FIG. 9 shows a detail of a ninth embodiment of the measuring system according to the invention in a circuit diagram.

Moreover, in FIG. 9, an alternative embodiment is shown. Here, instead of the regular signal splitter 50, a power coupler 50b is used. Along a direct path of the power coupler 50b the antenna 34 is connected to a variable gain amplifier 90, which is connected to the signal source 380.

The power coupler 50b comprises a first coupling path and a second coupling path. The coupling paths are connected to the detector module 32. The first coupling path is connected to a first partial detector 32a, while the second coupling path is connected to a second partial detector 32b. While the first partial detector 32a detects a signal generated by the signal source 380 and amplified by the variable gain amplifier 90, which is coupled out by the power coupler 50b, the second partial detector 32b detects the power of a signal received from the antenna 34, which is coupled out by the power coupler 50b.

By detecting the signal received from the antenna and also detecting the signal generated by the signal source 380 and amplified by the variable gain amplifier 90, an especially high measuring accuracy can be achieved.

Tenth Embodiment

Figure 10:
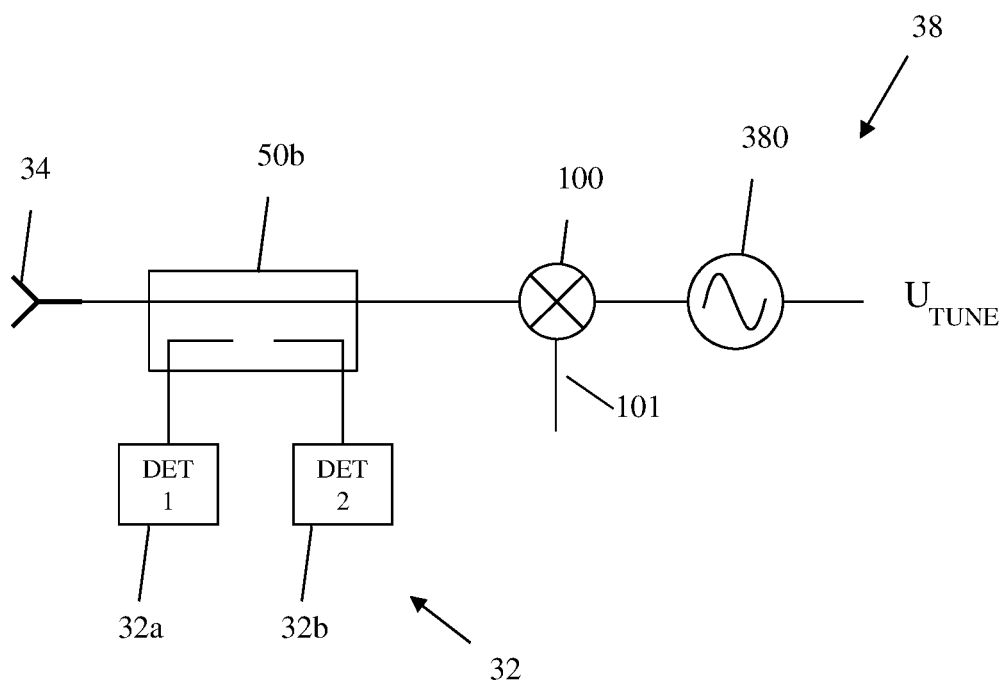
FIG. 10 shows a detail of a tenth embodiment of the measuring system according to the invention in a circuit diagram.

In FIG. 10, a further alternative embodiment is shown. Here, in comparison to FIG. 9, the variable gain amplifier 90 has been replaced by a mixer 100. The mixer 100 can be used for modifying the frequency of the signal generated by the signal source 380. Signal line 101 is for submitting the signal to the mixer 100. In this embodiment, possibly necessary filters have been omitted.

Eleventh Embodiment

Figure 11:
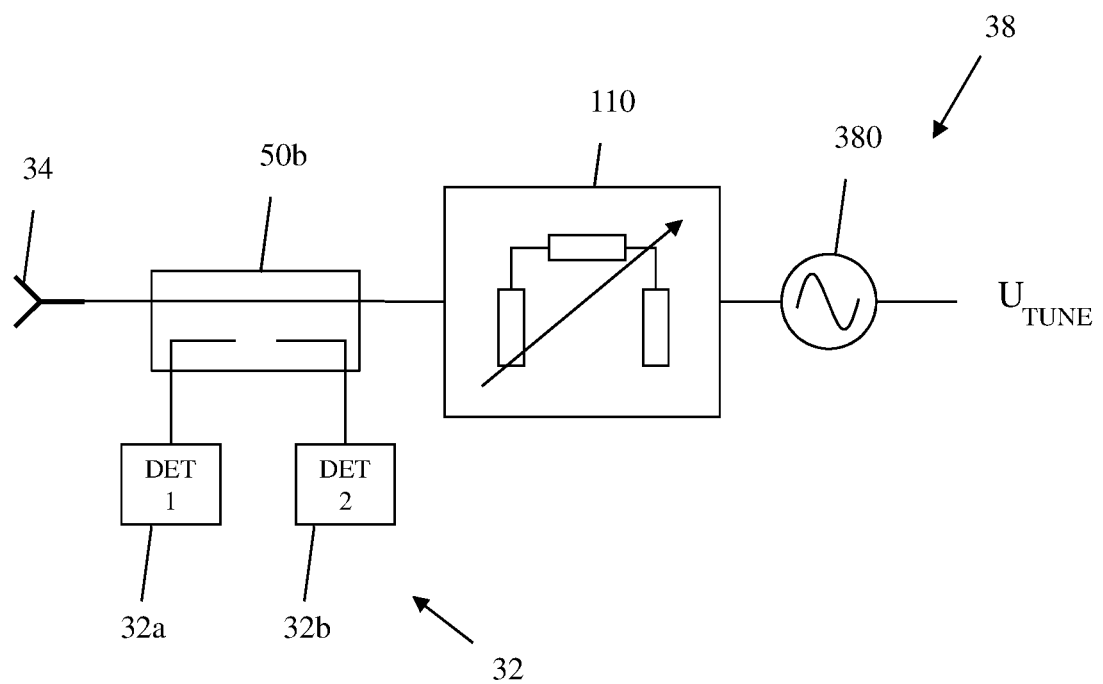
FIG. 11 shows a detail of an eleventh embodiment of the measuring system according to the invention in a circuit diagram.

In FIG. 11, a further alternative embodiment of the measuring system is shown. Here, instead of the mixer 100, an attenuator 110 is connected between the power coupler 50B and the signal source 380. The attenuator 110 can be used for regulating the amplitude of the signal to be transmitted by the antenna 34.

Twelfth Embodiment

Figure 12:
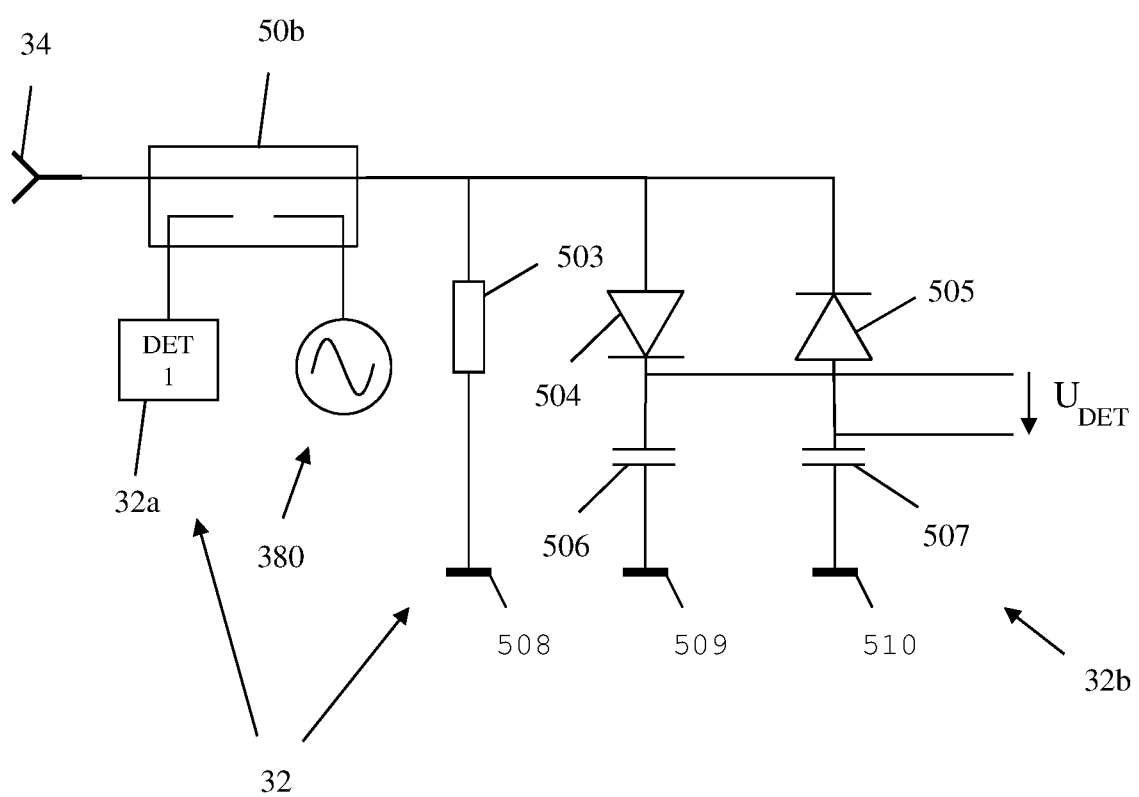
FIG. 12 shows a detail of a twelfth embodiment of the measuring system according to the invention in a circuit diagram.

Moreover, in FIG. 12, a further embodiment of the measuring system is shown. Here, the power coupler 50b still couples out the signal generated by the signal source 380 and measures it. At the same time, a direct path through the power coupler 50b is connected to a partial detector 32b, which is identical to the detector 32 of FIGS. 5-8. By this measure, an especially high detection accuracy of the signal received by the antenna 34 is achieved.

Thirteenth Embodiment

Figure 13:
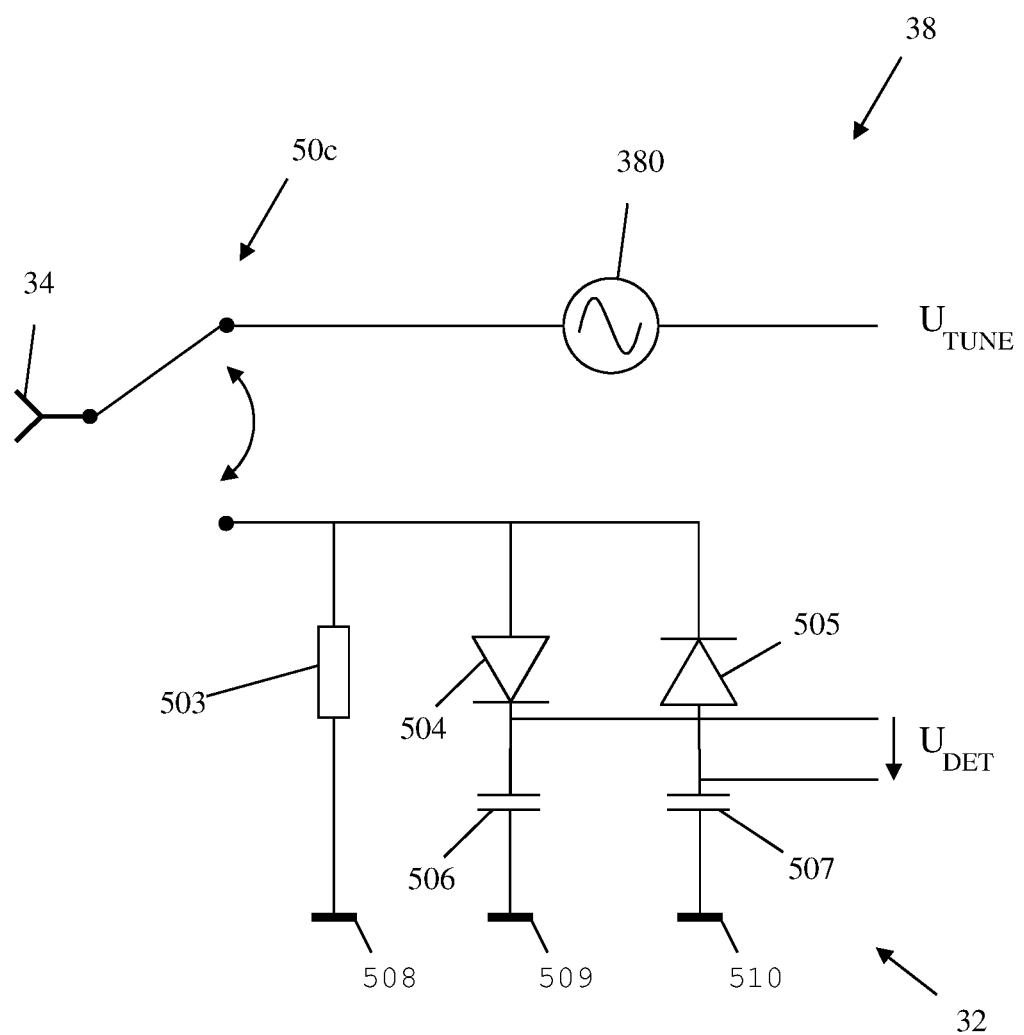
FIG. 13 shows a detail of a thirteenth embodiment of the measuring system according to the invention in a circuit diagram.

Finally, in FIG. 13 a further alternative embodiment is shown. In comparison to the embodiment of FIG. 5, the signal splitter 50 has been replaced by a switch 50c. The switch 50c actively switches the antenna 34 between the signal source 380 and the detector 32. The switching can be controlled, for example by the communication unit 35 of FIG. 3, or any other control unit within the signal processing module 3a. An especially high dampening of unwanted interfering signals can be achieved by using such a switch.

As an alternative the embodiments shown here, it is moreover possible to place the transmission module 38 onto the antenna module 3b, directly. This means that the signal source is present on the antenna module 3b. This further reduces the chance of interference coupling into the path between the signal source and the antenna.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to the examples and especially not to the specific components shown here. The characteristics of the exemplary embodiments can be used in any advantageous combination.

Although the present invention and its advantages have been described in detail, it should be understood, that various changes, substitutions and alterations can be made herein without departing from the spirit and scope of the invention as defined by the appended claims.

What claimed is:

1. A measuring system for performing over the air power measurements, comprising:
   a detector module, comprising a detector input,
   a transmitter module, comprising a transmitter output, and
   an antenna,
      wherein the detector input and the transmitter output are within a single housing and are at least temporarily connected,
      wherein at least the transmitter output or the detector input are at least temporarily connected to the antenna,
      wherein the detector module comprises detector diodes adapted to rectify a signal received by the antenna,
      wherein the transmitter module comprises a signal source,
      wherein the signal source is adapted to be regulated in a digital manner,
      wherein the detector input and the transmitter output are connected by an electrical power coupler,
      wherein the antenna is connected to a direct path of the power coupler, and
      wherein the power coupler comprises a first coupling path and a second coupling path and whereby the first coupling path and the second coupling path are connected to the detector module.

2. The measuring system of claim 1, wherein the detector input and the transmitter output are connected in a switchable manner.

3. The measuring system of claim 1, wherein the detector input and the transmitter output are connected interchangeably switchable to the antenna.

4. The measuring system of claim 1,
   wherein the detector input and the transmitter output are connected by a power coupler, and
   wherein the power coupler is adapted to couple out:
   a first signal, proportional to a signal received by the antenna, and/or
   a second signal, proportional to a signal transmitted by the transmitter module.

5. The measuring system of claim 1,
   wherein the detector input and the transmitter output are connected by a power coupler,
   wherein the power coupler is adapted to:
   couple out a first signal proportional to a signal transmitted by the transmitter module, and
   couple in a second signal transmitted by the transmitter module.

6. The measuring system of claim 1, wherein the signal source is a voltage controlled oscillator, or a fixed frequency oscillator, or a synthesizer.

7. The measuring system of claim 1, wherein the signal source is adapted to be regulated in an analog manner.

8. The measuring system of claim 1, wherein the transmitter module comprises an amplifier or a damper.

9. The measuring system of claim 1, wherein the transmitter module comprises an input, which is connected to an external signal source.

10. The measuring system of claim 1, wherein the transmitter module comprises a mixer.

11. The measuring system of claim 10, wherein the mixer comprises an input, which is connected to an external signal source.

\* \* \* \* \*